(12) United States Patent
Guenther et al.

(10) Patent No.: US 6,930,321 B2
(45) Date of Patent: Aug. 16, 2005

(54) ROBUST ELECTRODE PATTERNING IN OLED DEVICES

(75) Inventors: Ewald Guenther, Singapore (SG); Hooi Bin Lim, Penang (MY); Ed Vin Soh, Petaling Jaya (MY); Hou Siong Tan, Port Dickson (MY); Hagen Klausmann, Penang (MY)

(73) Assignee: Osram Opto Semiconductors (Malaysia) Sdn. Bhd, Penang (MY)

( * ) Notice: Subject to any disclaimer, the term of this patent is extended or adjusted under 35 U.S.C. 154(b) by 0 days.

(21) Appl. No.: 10/707,836

(22) Filed: Jan. 15, 2004

(65) Prior Publication Data

US 2004/0227139 A1 Nov. 18, 2004

Related U.S. Application Data

(60) Division of application No. 10/064,982, filed on Sep. 6, 2002, now Pat. No. 6,696,312, which is a continuation-in-part of application No. 09/989,363, filed on Nov. 20, 2001, now Pat. No. 6,699,728, which is a continuation-in-part of application No. PCT/SG00/00134, filed on Sep. 6, 2000.

(51) Int. Cl.$^7$ .............................................. H01L 21/04
(52) U.S. Cl. ............................. 257/40; 257/88; 257/79; 257/59; 257/98; 257/91
(58) Field of Search .............................. 438/24, 39, 99, 438/608, 609, 780, 782, FOR 135, FOR 416, FOR 492; 257/88, 79, 40, 98, 59, 91

(56) References Cited

U.S. PATENT DOCUMENTS

| | | | |
|---|---|---|---|
| 5,701,055 A | 12/1997 | Nagayama et al. | 313/504 |
| 5,742,129 A | 4/1998 | Nagayama et al. | 315/167 |
| 5,804,917 A | 9/1998 | Takahashi et al. | 313/504 |
| 5,952,037 A | 9/1999 | Nagayama et al. | 427/66 |
| 5,952,778 A | 9/1999 | Haskal et al. | 313/504 |
| 5,962,970 A | 10/1999 | Yokoi et al. | 313/506 |
| 6,111,356 A | 8/2000 | Roitman et al. | 313/506 |
| 6,198,220 B1 | 3/2001 | Jones et al. | 313/512 |
| 6,373,187 B1 * | 4/2002 | Nagayama et al. | 313/506 |
| 6,696,312 B2 | 2/2004 | Guenther et al. | 438/39 |
| 6,699,728 B2 | 3/2004 | Guenther et al. | 438/39 |
| 2001/0000744 A1 | 5/2001 | Wolk et al. | 430/200 |
| 2001/0017516 A1 | 8/2001 | Guenther | 313/504 |

FOREIGN PATENT DOCUMENTS

| | | |
|---|---|---|
| DE | 19918193 A1 | 11/1999 |
| EP | 0 884 930 A | 12/1998 |
| EP | 0 951 073 A | 10/1999 |
| EP | 0 938 248 A | 2/2003 |
| EP | 0 762 806 A2 | 6/2003 |
| GB | 2 347 017 A | 8/2000 |
| JP | 10-321372 | 12/1998 |
| JP | 11-283752 A | 10/1999 |
| WO | WO 99/16039 A2 | 4/1999 |
| WO | WO 01/41229 A | 6/2001 |
| WO | WO 02/21883 A1 | 3/2002 |

OTHER PUBLICATIONS

DeLongchamp et al., "Laser–by–Layer Assembly of PEDOT/Polyaniline Electrochromic Devices", Advanced Materials, Oct. 2, 2001, vol. 13, No. 19, Oct. 2, pp. 1455–1459.

* cited by examiner

*Primary Examiner*—George Fourson
*Assistant Examiner*—Julio J. Maldonado
(74) *Attorney, Agent, or Firm*—Fish & Richardson P.C.

(57) ABSTRACT

An OLED device having a conductive layer patterned by pillars to form electrodes in the device is disclosed, wherein portions of the pillars have at least 2 sub-rows to prevent shorting of adjacent electrodes. In one embodiment, the ends of the pillars are split into at least 2 sub-rows.

17 Claims, 11 Drawing Sheets

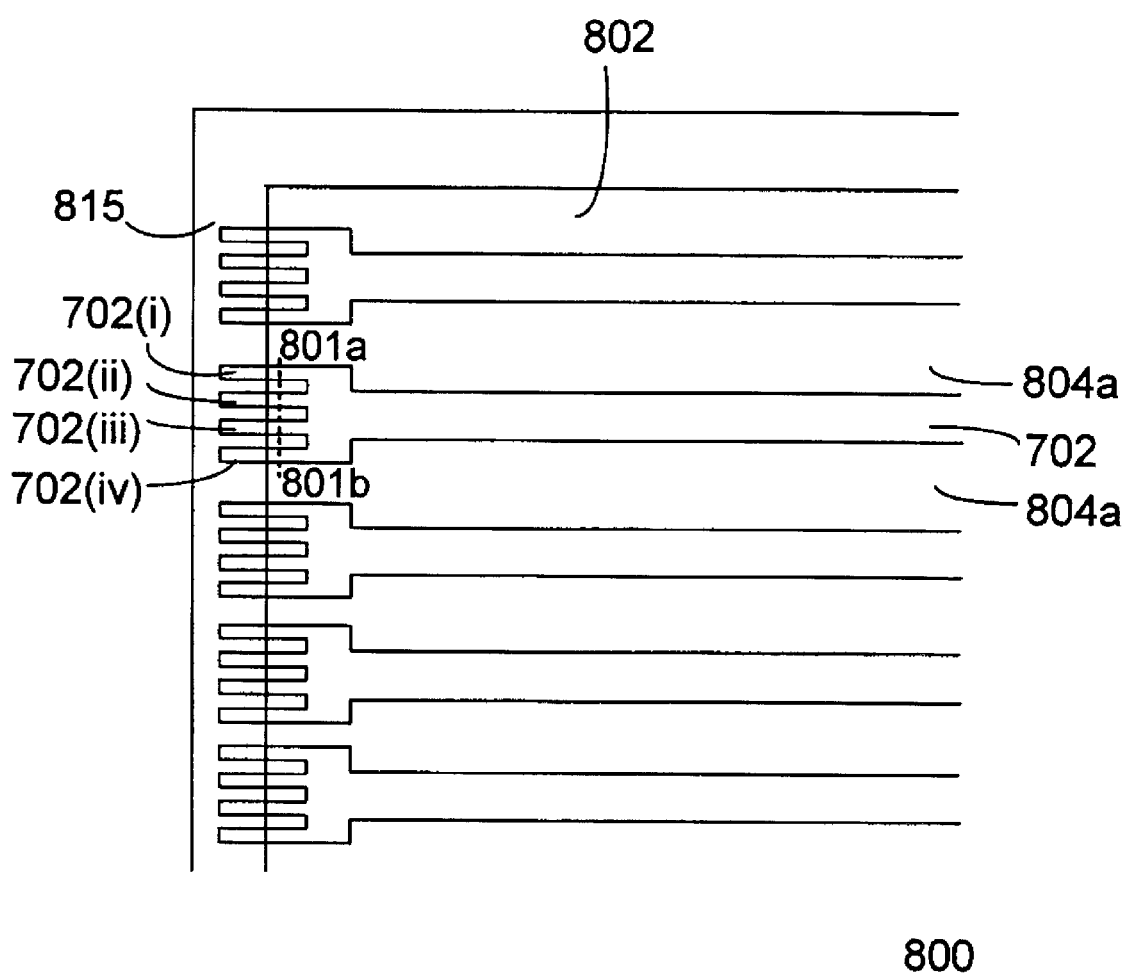

US 6,930,321 B2

ROBUST ELECTRODE PATTERNING IN OLED DEVICES

CROSS REFERENCE TO RELATED APPLICATIONS

This application is a divisional of application Ser. No. 10/064,982 filed Sep. 6, 2002 now U.S. Pat. No. 6,696,312, which is a continuation-in-part of application Ser. No. 09/989,363 filed Nov. 20, 2001 now U.S. Pat. No. 6,699,728, which is a continuation-in-part of International Application No. PCT/SG00/00134 filed Sep. 6, 2000. All of these applications are incorporated by reference herein in their entirety.

BACKGROUND OF INVENTION

FIG. 1 shows a pixelated OLED device 100, comprising a functional stack on a substrate 102. The functional stack comprises one or more organic functional layers 104 between two conductive functional layers (106 and 108) which serve as electrodes (i.e. anode and cathode). The conductive layers are patterned as desired. For example, the conductive layers can be patterned to form rows of anodes in a first direction and columns of cathodes in a second direction. OLED cells or pixels are located in an active region where the cathodes and anodes overlap. Charge carriers are injected through the cathodes and anodes via bond pads 112 for recombination in the organic layers. The recombination of the charge carriers causes the organic layer of the pixels to emit visible radiation. The device is encapsulated with a cap 110, hermetically sealing the cells.

As shown in FIG. 1, pillars 114 are used to facilitate patterning of the upper conductive layer 108. The pillars are formed on the substrate after the formation of the lower conductive layer 106. Thereafter, the organic layer and conductive layer are deposited. Due to the profile of the pillars, the continuity of the upper conductive layer is disrupted, leaving segments of the conductive layer 108a over the organic layer 104 and segments 108b on top of the pillars.

Referring to FIG. 2(a), the upper conductive layer 108 is deposited selectively onto the active region, through an aperture in a shadow mask 202. The shadow mask is typically in contact with the substrate during deposition. Close contact between the substrate and the shadow mask may lead to the generation of shorts between adjacent electrodes, such as 108a(i) and 108a(ii). Particles 206 accumulated on the shadow mask surface may be transferred to the substrate, causing shorting between electrodes 108a(i) and 108a(ii), as shown in FIG. 2(b). Shorting may also be caused by, for example, damage of the pillar structures by the shadow mask during alignment.

Known methods employed to protect the substrate from damage by the shadow mask include maintaining a gap between the shadow mask and the substrate. This gives rise to a blurring of the edges of the conductive layer and a reduction in precision. The conductive layer is deposited over an area larger than the active area to compensate for the blurring. Hence, the outer dimensions of the OLED device are increased without increasing the useful light emitting active area. Moreover, maintaining the gap between the shadow mask and substrate requires additional control complexity.

As evidenced from the foregoing discussion, it is desirable to provide a method that improves the reliability of electrode patterning in the fabrication of OLED devices.

SUMMARY OF INVENTION

The invention relates generally to the fabrication of devices such as OLED devices. The invention relates particularly to the patterning of a conductive layer to form electrodes. Pillars are provided to pattern the conductive layer, wherein portions of the pillars have at least 2 sub-rows to prevent shorting of adjacent electrodes. In one embodiment, the ends of the pillars are split into at least 2 sub-rows.

BRIEF DESCRIPTION OF DRAWINGS

FIGS. 4–7, 8(a) and 8(b) show a process of fabricating the OLED device according to one embodiment of the invention.

DETAILED DESCRIPTION

Figure 1:
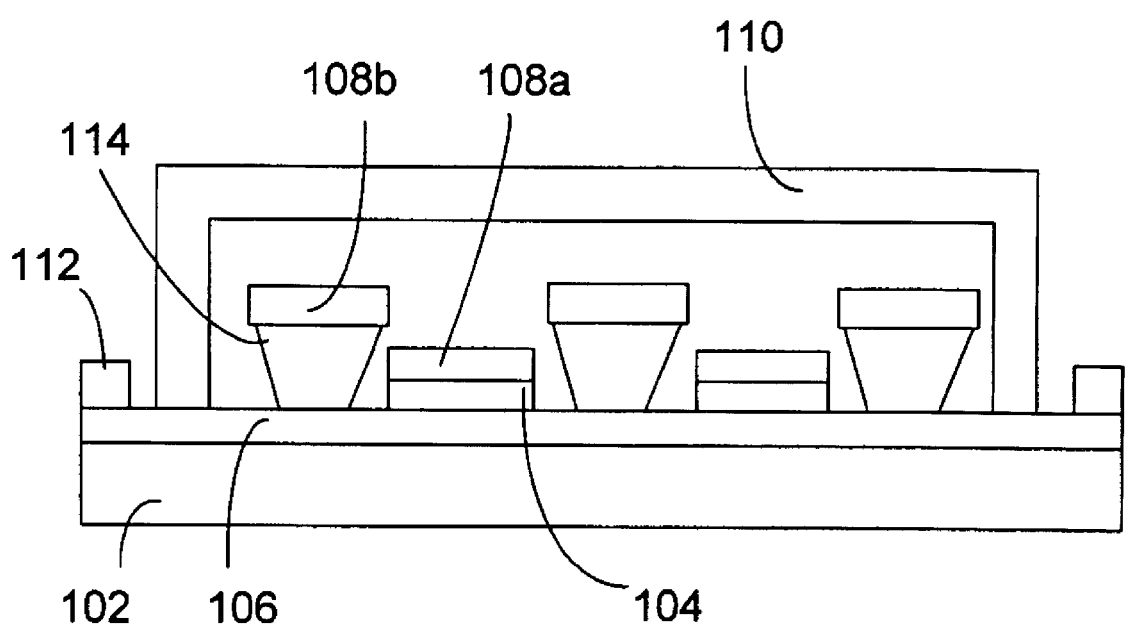
FIG. 1 shows a conventional OLED device employing pillars.
Figure 2A:
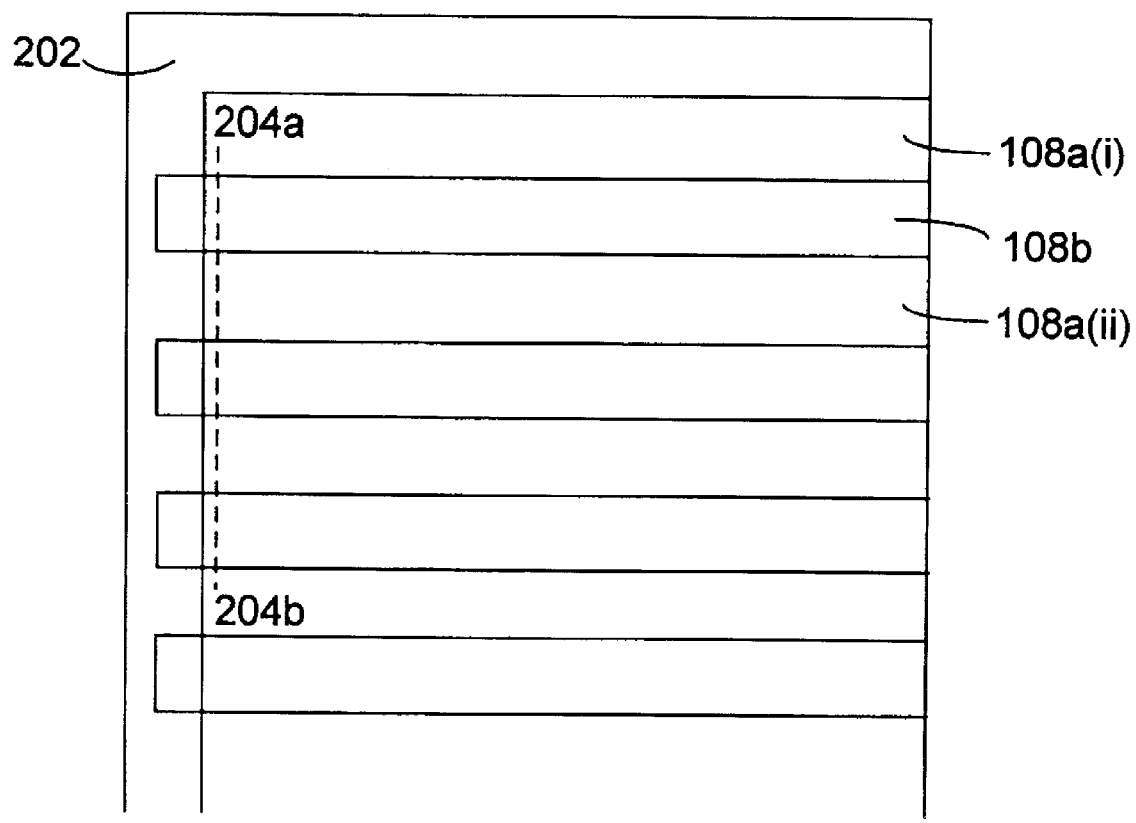
FIGS. 2(a) and 2(b) show a conventional method of patterning a conductive layer.
Figure 2B:
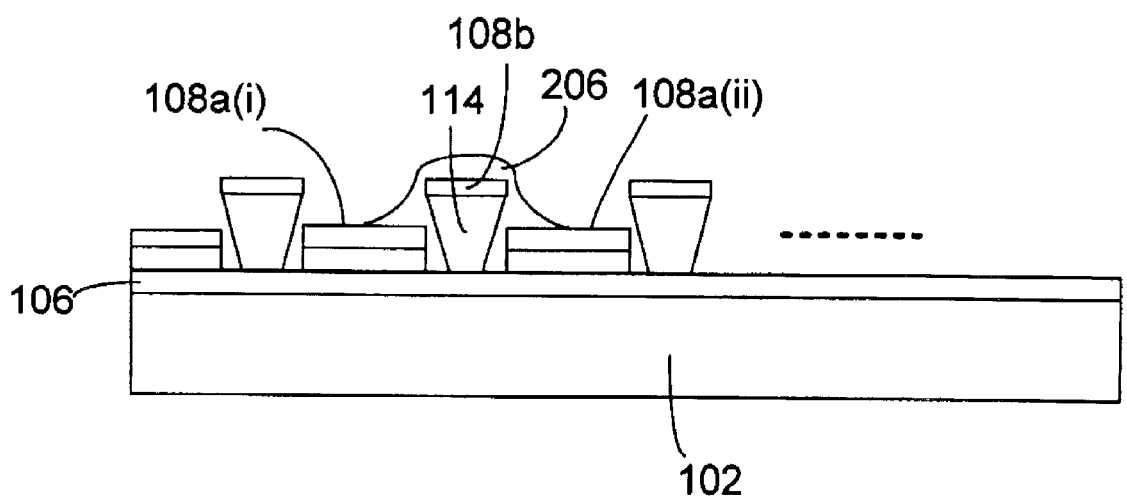
Figure 3A:
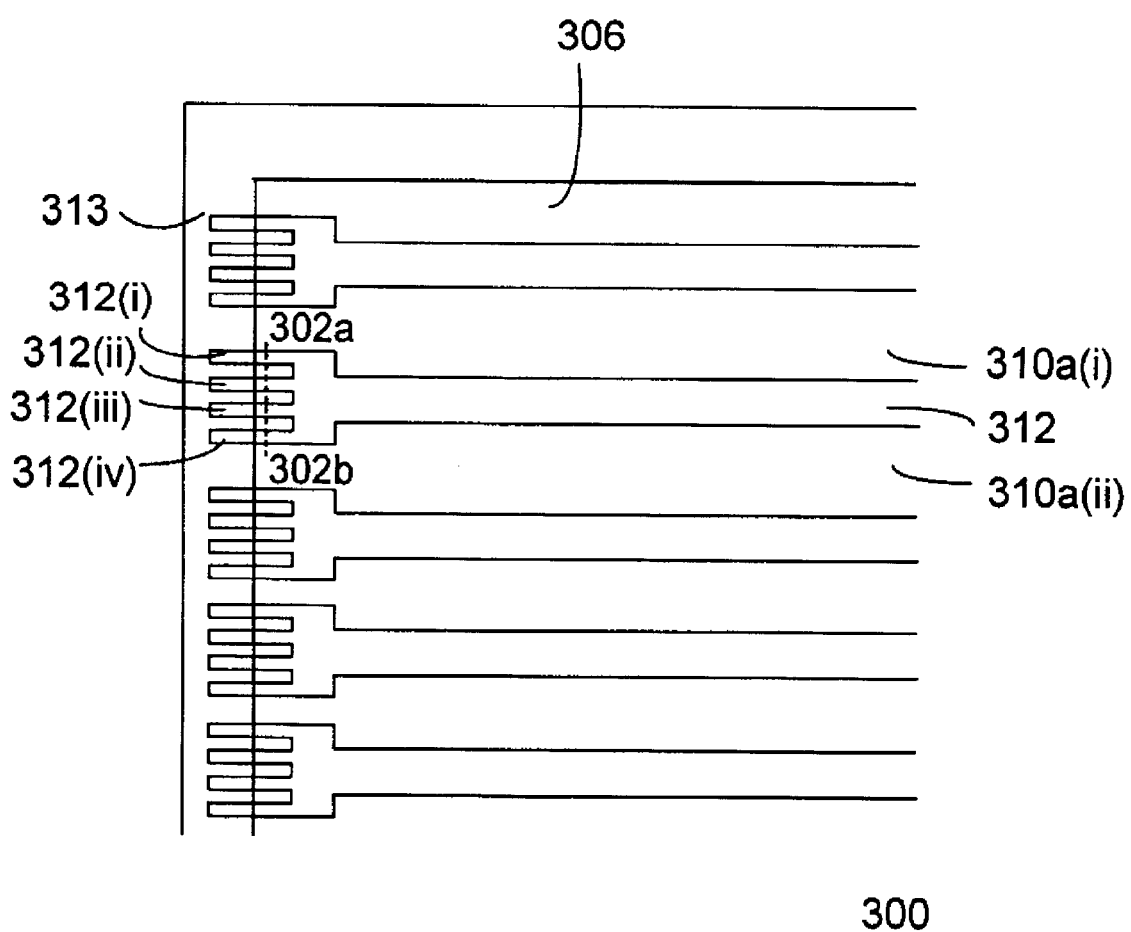
FIGS. 3(a) and 3(b) show an OLED device according to one embodiment of the invention.
Figure 3B:
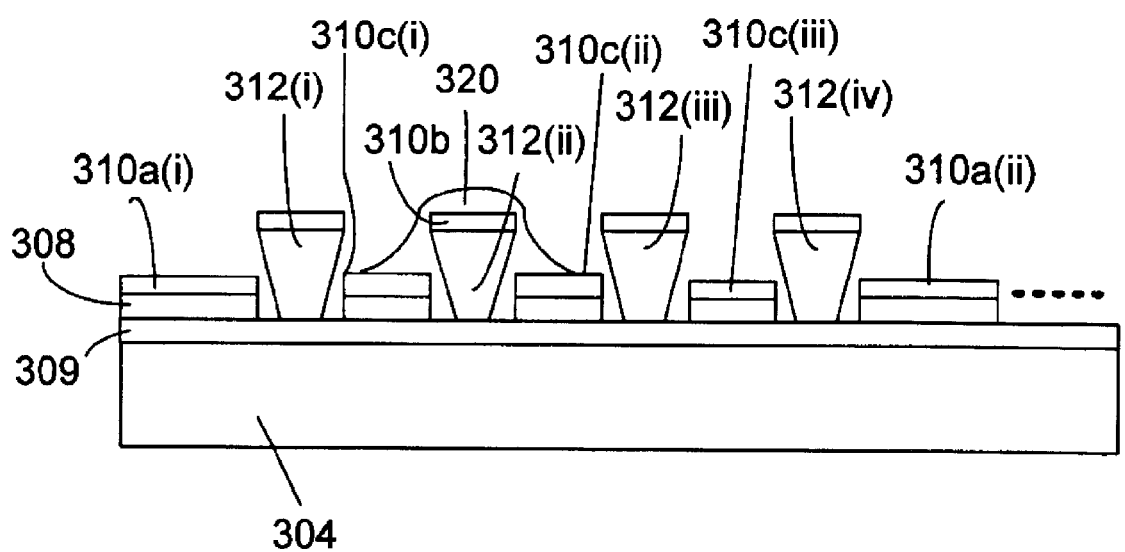

FIG. 3(a) shows the layout of a section of an OLED device 300 and FIG. 3(b) shows a cross-section of the device along line 302a–302b according to one embodiment of the invention. The device comprises a substrate 304 on which OLED cells are formed in the active region 306. The OLED cells comprise one or more organic functional layers 308 formed between first conductive layer 309 and second conductive layer 310a, the first and second conductive layers serving as first and second electrodes. In one embodiment, the first electrodes are anodes and the second electrodes are cathodes. Forming the first electrodes that are cathodes and second electrodes that are anodes is also useful. The first and second electrodes, for example, are formed as strips in respective first and second directions to create an array of OLED cells in the active region. Typically, the first and second directions are orthogonal to each other. Bond pads are electrically coupled to the cathodes and anodes. A cap is preferably provided to encapsulate the OLED cells.

Pillars 312 which extend above the OLED cells are provided on the substrate surface to facilitate the patterning of the second conductive layer 310. The pillars can also extend the height of the cavity to support the cap. This is particularly useful for flexible OLED devices since the cap is prevented from contacting and damaging the cells. The pillars are used to pattern the conductive layer as desired to create separate OLED cells. For example, the pillars create rows of second electrodes 310a to form an array of OLED cells. Pillars which create other patterns for the second electrodes are also useful. OLED cells are located between the pillars where the second electrodes overlap the first electrodes. The profile of the pillars, in one embodiment, comprises tapered sides. The taper angle is, for example, about 30°–75° from horizontal. Other types of profiles are also useful, such as t-shaped profiles described in, for example, US patent application "Production of Structured Electrodes", U.S. Ser. No. 09/737,656, which is herein incorporated by reference for all purposes.

The second conductive layer 310 is selectively deposited onto the active region, through an aperture in a shadow mask 313. The shadow mask is preferably in contact with the substrate to prevent blurring of the electrode edges. As previously discussed, close contact of the pillars with the shadow mask may lead to shorting of adjacent electrodes in conventional methods. This may be caused by, for example, defects induced on the pillars during alignment or particles transferred from the shadow mask to the substrate.

In accordance with the invention, portions of the pillars are split into at least 2 sub-rows to prevent shorting of adjacent electrodes. In one embodiment shown in FIGS. 3(a) and (b), the pillar 312 is split into four parallel or substantially parallel sub-rows 312(i)–(iv) at the ends of the pillar rows where the shadow mask is in close contact with the pillars. Non-parallel sub-rows are also useful. Preferably, the sub-rows do not contact each other. As shown in FIG. 3(b), a shorting of conductive segments 310c(i) and 310c(ii) caused by, for example transfer of conductive particles 309 from the shadow mask onto the substrate, will not cause the adjacent electrodes 310a(i) and 310a(ii) to be electrically shorted. The electrodes 310a(i) and 310a(ii) remain isolated from one another, and may be shorted only if all the conductive segments 310c(i)–(iii) and electrodes 310a(i)–(ii) are simultaneously shorted. Hence, the probability of shorting adjacent electrodes is greatly reduced.

Figure 4:
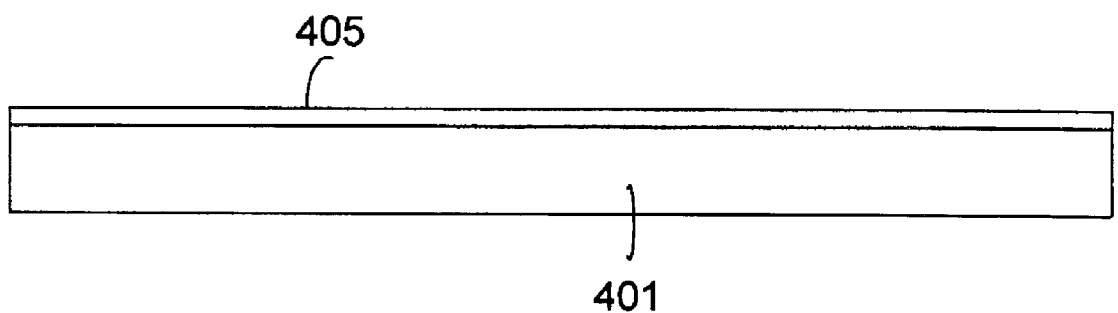

FIGS. 4–7, 8(a) and 8(b) show a process for fabricating an OLED device in accordance with one embodiment of the invention. Referring to FIG. 4, a substrate 401 is provided. In one embodiment, the substrate comprises a transparent substrate, for example, soda lime or borosilicate glass. To form flexible devices, materials, such as plastics, can be used. Other types of materials can also be used to serve as the substrate. The substrate typically is about 0.1–1.1 mm thick.

The substrate includes first electrodes 405 formed on the surface thereof. The first electrodes serve as, for example, anodes. The anodes are formed from a conductive material. In one embodiment, the conductive material comprises a transparent conductive material such as indium-tin-oxide (ITO). Other transparent conductive materials, for example, indium-zinc-oxide, zinc-oxide, tin-oxide, are also useful. In one embodiment, the anodes are arranged in strips in a first direction, the strips are being separated by spaces. Preferably, the space separating the anodes is less than 50 $\mu$m wide. Connections to bond pads can also be provided. Various techniques, such as photolithography, can be used to form the anodes.

Figure 5:
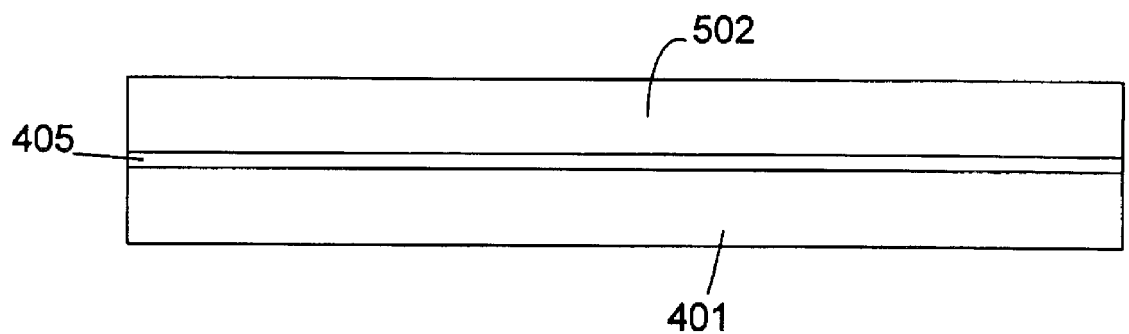
Figure 6:
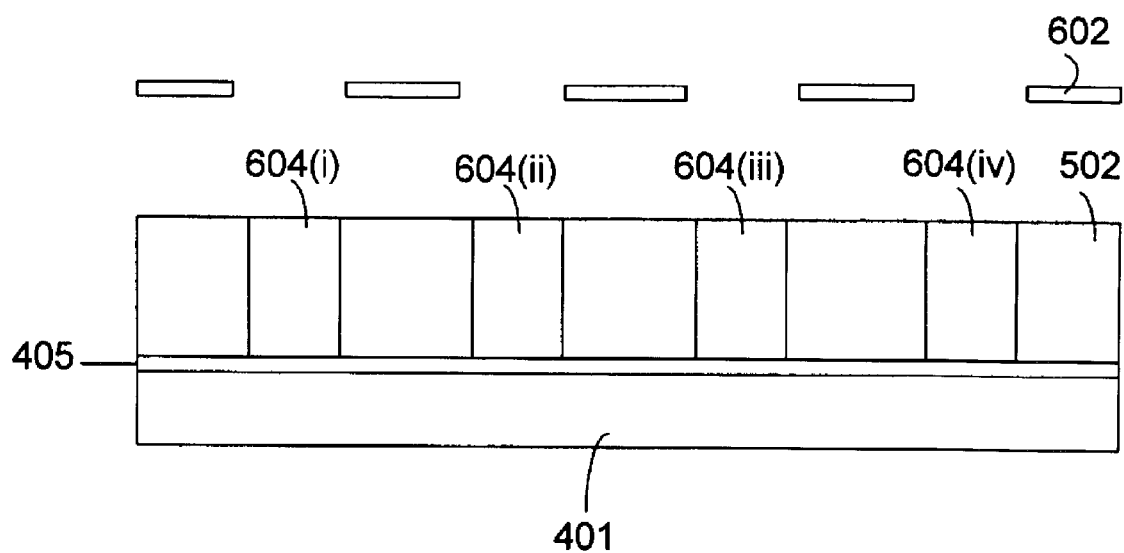

Referring to FIG. 5, a device layer 502 is deposited on the substrate. The device layer is used to create the pillars which facilitate patterning of a conductive layer to form the second electrodes (e.g., cathodes). More than one device layer is also useful for forming the pillars. The thickness of the device layer is equal to the height of the pillars. The thickness of the device layer is, for example, about 0.5–50 $\mu$m, preferably about 1–10 $\mu$m. In one embodiment, the device layer comprises a negative acting photoresist such as AZ 5214E manufactured by Clariant. The resist is deposited on the substrate by, for example, spin-coating. Other types of photosensitive materials, such as photosensitive polyamide or photosensitive polybenzoxazole, are also useful. In addition, electron cure resist systems, such as those manufactured by Allied Signal, can also be used to form pillars having the desired cross-sectional shape. Non-photosensitive insulating materials such as resins can also be used to form the pillars. Other methods of forming the pillars, such as etching, are also useful.

In accordance with the invention, the layout of the pillars on the surface of the substrate is designed to prevent shorting of adjacent electrodes. In one embodiment, the end portions of the pillars are split into four sub-rows, corresponding to regions 604(i)–(iv) shown in FIG. 6. The device layer is selectively exposed to light from an exposure source through a mask 602. The exposure process is designed to form pillars with the desired profile. The exposure process comprises, for example, successively exposing the photosensitive layer with electrons or charged particles having different energies which have different penetration depths to form a tapered profile during development.

The resist is then prepared for development to remove the unexposed portions. The preparation, for a negative acting resist, includes a post-exposure bake to cross-link the resist in the exposed regions. The post-exposure bake is performed at, for example, about 120° C. for about 60–90 seconds. Cross-linking renders the resist insoluble to the resist development chemistry. After the post-exposure bake, the resist is subjected to a flood exposure from the exposure source (e.g. exposure without mask). The flood exposure renders the previously un-exposed portions of the resist soluble. The dose of the flood exposure is, for example, about 1000 mJ/cm$^2$.

Figure 7:
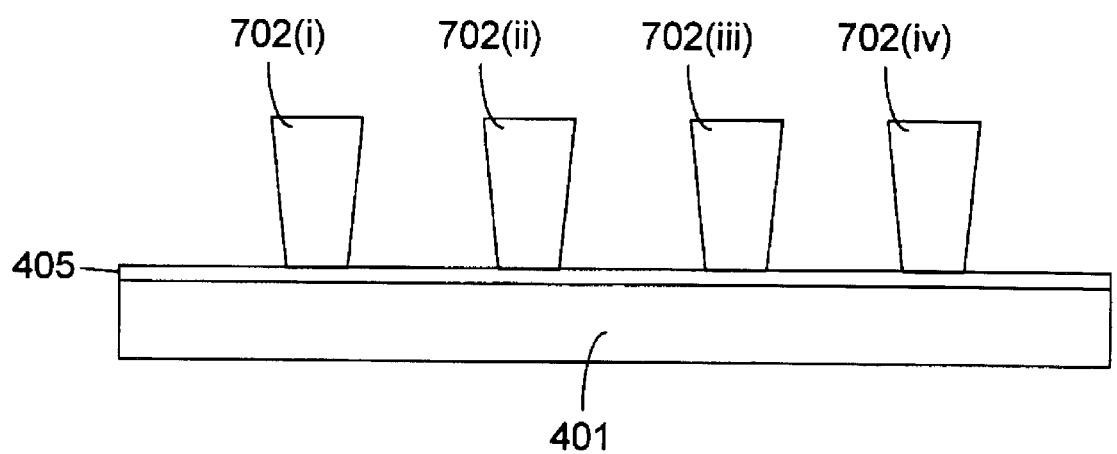

Referring to FIG. 7, the device layer is developed with a resist development chemistry to remove the unexposed regions, leaving sub-pillars 702(i)–(iv). In one embodiment, the resist chemistry comprises an alkaline developer such as A2 726 manufactured by Clariant. The resist is developed in the development chemistry at room temperature for about 60 seconds. Because the lower parts of the exposed regions were underexposed, they are more soluble to the resist chemistry. This creates pillars with an under-cut, resulting in a cross-section that is narrower at the bottom than the top. The resist is then rinsed with deionized water to remove the developer.

After forming the pillars, the resist is cured to improve the mechanical stability of the pillars and to render them inert to the organic solvents used to form the functional organic layers. In one embodiment, the resist is cured by heating the substrate at a temperature of about 160° C. for about 6 hours. Other curing techniques such as electron beam (e-beam), particle (proton, alpha) or UV curing can also be used. After curing, the substrate is cleared by subjecting it to UV-O$_3$ for about 3 minutes, removing small organic residues on the exposed portions of the substrate.

Figure 8B:
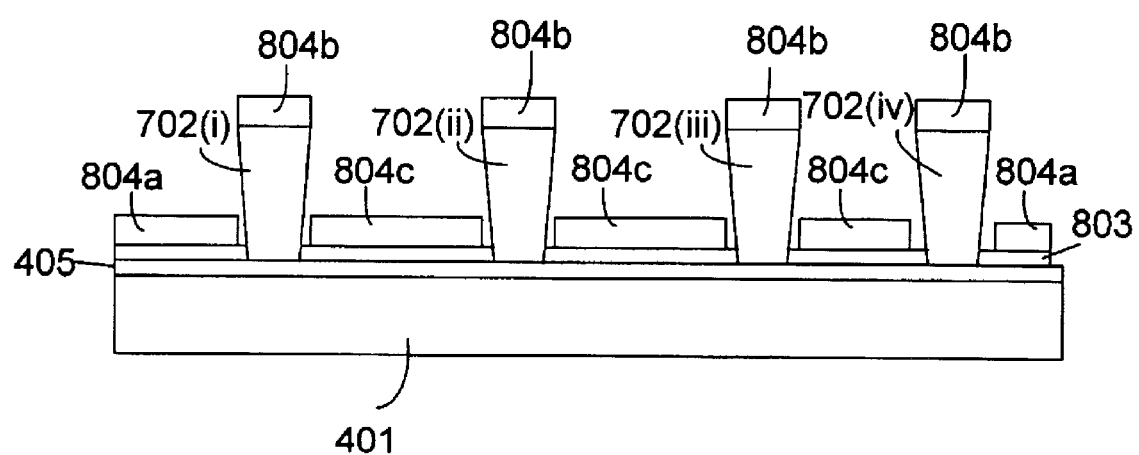

FIG. 8(a) shows the layout of a section of the device according to one embodiment of the invention. FIG. 8(b) shows a cross section of the device, along line 801a–801b in FIG. 8(a). A functional organic layer 803 is deposited in the active region 802 on the substrate. In one embodiment, the functional organic layer comprises a conjugated polymer. Additional functional layers can be deposited to form a functional organic stack. The organic layer is deposited by, for example, wet coating or vacuum deposition. The thickness of the organic layer or stack is typically about 2–200 nm.

A conductive layer 804 is deposited on the substrate through a shadow mask 815. The conductive layer comprises, for example, Ca, Mg, Ba, Ag, Al or a mixture or alloy thereof. Other conductive materials, particularly those comprising a low work function, can also be used to form the second conductive layer. In one embodiment, the second conductive layer comprises Ca. The Ca is deposited by thermal evaporation at a rate of 1 nm/s and a pressure of about 10$^{-5}$ mbar. Other deposition techniques, such as sputtering (PVD), chemical vapor deposition (CVD), plasma enhanced chemical vapor deposition (PECVD) or metal organic chemical vapor deposition (MOCVD), are also useful.

The conformity of the conductive layer is interrupted due to the height and profile of the pillars, resulting in parts 804a and 804c of the conductive layer being deposited in regions between the pillars and parts 804b being formed on the top surface of the pillars. The parts of the conductive layer 804a between the pillars serve as second electrodes (e.g. cathodes). The intersections of the cathodes and anodes form organic LED pixels. The electrodes 804a are separated by pillar sub-rows 702(i)–(iv) at regions where the shadow mask is in close contact with the pillars to reduce the possibility of shorting. The process continues to complete the OLED device. For example, a cavity cap is mounted on the substrate to encapsulate the device and bond pads are formed to provide electrical access to the OLED pixels.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   a substrate including at least one organic layer formed between first and second conductive layers, the first and second conductive layers serving as first and second electrodes; and
   pillars on the substrate for patterning the second conductive layer to form the second electrodes, wherein end portions of the pillars are split into at least 2 sub-rows to prevent shorting of adjacent electrodes.

2. The device of claim 1 wherein the pillars are split into 4 sub-rows.

3. The device of claim 2 wherein the sub-rows are substantially parallel.

4. The device of claim 2 wherein the sub-rows are non-parallel.

5. The device of claim 1 wherein the sub-rows are substantially parallel.

6. The device of claim 1 wherein the sub-rows are non-parallel.

7. The device of claim 1 wherein the pillars comprise tapered sidewalls.

8. The device of claim 1 wherein the pillars comprise t-shaped profiles.

9. A device comprising:
   a substrate including at least one organic layer formed between first and second conductive layers, the first and second conductive layers serving as first and second electrodes, wherein the second conductive layer is deposited through a shadow mask; and
   pillars on the substrate for patterning the second conductive layer to form the second electrodes, wherein portions of the pillars in contact with the shadow mask are split into at least 2 sub-rows to prevent shorting of adjacent electrodes.

10. The device of claim 9 wherein end portions of the pillars are split into at least 2 sub-rows.

11. The device of claim 10 wherein the pillars are split into 4 sub-rows.

12. The device of claim 10 wherein the sub-rows are substantially parallel.

13. The device of claim 10 wherein the sub-rows are non-parallel.

14. The device of claim 9 wherein the sub-rows are substantially parallel.

15. The device of claim 9 wherein the sub-rows are non-parallel.

16. The device of claim 9 wherein the pillars comprise tapered sidewalls.

17. The device of claim 9 wherein the pillars comprise t-shaped profiles.

* * * * *